United States Patent
Koitabashi et al.

(10) Patent No.: US 7,288,363 B2
(45) Date of Patent: Oct. 30, 2007

(54) CHEMICALLY AMPLIFIED POSITIVE RESIST COMPOSITION AND PATTERNING PROCESS

(75) Inventors: Ryuji Koitabashi, Joetsu (JP); Satoshi Watanabe, Joetsu (JP); Youichi Ohsawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 271 days.

(21) Appl. No.: 11/105,457

(22) Filed: Apr. 14, 2005

(65) Prior Publication Data

US 2005/0233245 A1    Oct. 20, 2005

(30) Foreign Application Priority Data

Apr. 15, 2004    (JP) .............................. 2004-120635

(51) Int. Cl.
G03F 7/004    (2006.01)
G03F 7/30    (2006.01)

(52) U.S. Cl. .................... 430/270.1; 430/326; 430/330; 430/905; 430/907; 430/910; 430/922

(58) Field of Classification Search ............. 430/270.1, 430/905, 907, 910, 326, 330, 922
See application file for complete search history.

(56) References Cited

U.S. PATENT DOCUMENTS

| | | | |
|---|---|---|---|
| 4,491,628 A | 1/1985 | Ito et al. | |
| 5,310,619 A | 5/1994 | Crivello et al. | |
| 5,346,803 A * | 9/1994 | Crivello et al. | 430/270.1 |
| 6,492,091 B2 * | 12/2002 | Kodama et al. | 430/270.1 |
| 6,841,334 B2 * | 1/2005 | Yagihashi et al. | 430/270.1 |
| 2003/0068573 A1 * | 4/2003 | Takata et al. | 430/270.1 |

FOREIGN PATENT DOCUMENTS

| | | |
|---|---|---|
| JP | 2-27660 B2 | 6/1983 |
| JP | 63-27829 A | 2/1988 |
| JP | 11-249309 A | 9/1999 |

* cited by examiner

*Primary Examiner*—John S. Chu
(74) *Attorney, Agent, or Firm*—Birch, Stewart, Kolasch & Birch, LLP

(57) ABSTRACT

A chemically amplified positive resist composition comprising a specific 2,4,6-triisopropylbenzenesulfonate compound as a photoacid generator, a polymer which changes its solubility in an alkaline developer under the action of acid, and a basic compound has a high sensitivity, a high contrast of dissolution of resist film, a high resolution, and good storage stability.

9 Claims, No Drawings

CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2004-120635 filed in Japan on Apr. 15, 2004, the entire contents of which are hereby incorporated by reference.

TECHNICAL FIELD

This invention relates to chemically amplified positive resist compositions which are sensitive to high-energy radiation such as UV, deep UV, electron beams, x-rays, excimer laser beams, γ-rays, and synchrotron radiation and suitable as micropatterning materials for the fabrication of VLSI and photomasks, and a patterning process using the same.

BACKGROUND ART

In the drive for higher integration in integrated circuitry, it is desired to form patterns to finer feature sizes. Chemically amplified resist compositions are believed promising to this end. The light source used for exposure is typically high-energy radiation such as UV, deep UV and electron beams as disclosed in U.S. Pat. Nos. 4,491,628 and 5,310,619 (JP-B 2-27660 and JP-A 63-27829). The electron beam lithography is not only of interest as the microprocessing technology capable of patterning to a feature size of 0.1 µm or less, but also becomes indispensable to form mask patterns.

However, electron beam imagewise writing takes a longer time than the conventional block exposure process. To increase the throughput, resists are thus required to have a higher sensitivity. The stability with time of resist in vacuum during and after imagewise writing is also one of crucial performance factors. Some coatings on substrates, for example, coatings (e.g., $SiO_2$, TiN, $Si_3N_4$) on silicon wafers and chromium oxide on mask blanks can affect the resist profile after development depending on the particular type of substrate. For achieving high resolution and maintaining a profile after etching, it is one of important performance factors that the pattern profile of resist is kept rectangular independent of the substrate type.

Reference is also made to JP-A 11-249309.

SUMMARY OF THE INVENTION

An object of the invention is to provide a chemically amplified positive resist composition which lends itself to the micropattern-forming lithography, especially electron beam lithography, so that it meets the requirements of high sensitivity, high resolution and age stability and produces a satisfactory pattern profile independent of the underlying substrate. Another object is to provide a process for forming a pattern using the same.

The inventor has discovered that compounds of formulae (1a), (1b), (1c), (1d), and (1e), shown below, are effective as a photoacid generator (1) in chemically amplified positive resist compositions. More particularly, a chemically amplified positive resist composition comprising a polymer which changes its solubility in an alkaline developer under the action of acid, especially a polymer comprising recurring units of formula (2), the photoacid generator (1), a photoacid generator other than (1), and a solvent (e.g., propylene glycol monomethyl ether acetate, ethyl lactate) has a high sensitivity, a high contrast of dissolution of resist film, a high resolution, good storage stability and age stability, exposure latitude, and process amenability. After exposure, it forms a satisfactory pattern profile independent of the underlying substrate. Owing to these advantages, the composition is fully acceptable in industrial practice and especially suited as a micropatterning material for the manufacture of VLSI or the formation of photomask patterns.

In a first aspect, the invention provides a chemically amplified positive resist composition comprising at least one compound (1) selected from compounds having the formulae (1a), (1b), (1c), (1d) and (1e) shown below, a polymer which changes its solubility in an alkaline developer under the action of the acid, and a basic compound. The compound (1) is capable of generating an acid upon exposure to radiation or electron beams and serves as a photoacid generator.

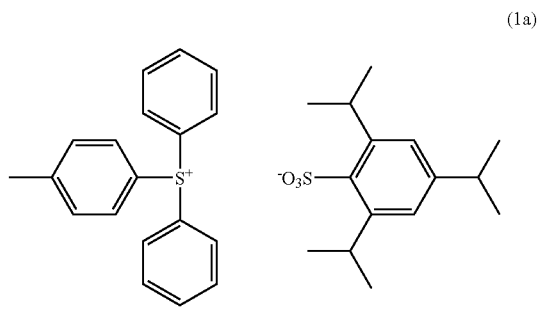

(1a)

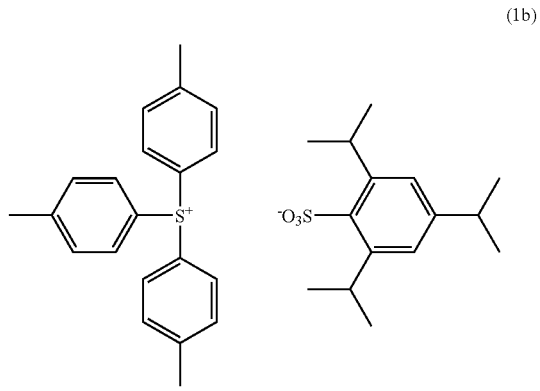

(1b)

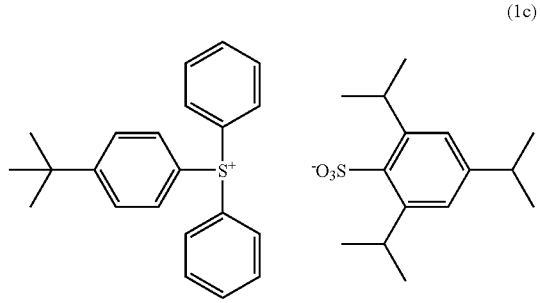

(1c)

-continued (1d)

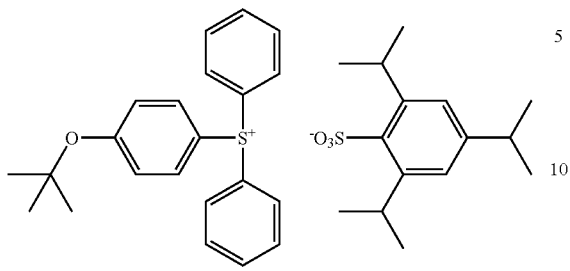

(1e)

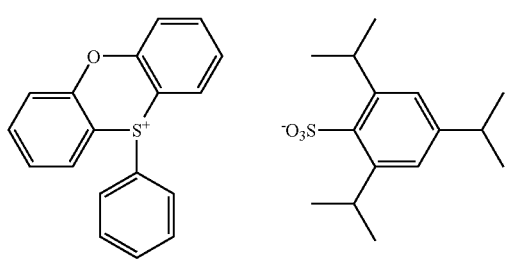

The chemically amplified positive resist composition comprising the photoacid generator (1), a polymer and a basic compound lends itself to the micropattern-forming lithography using high-energy radiation, especially electron beams, so that it exhibits a high sensitivity, a high resolution and age stability.

Of the compounds shown, the compounds of formulae (1d) and (1e) are novel. Thus the present invention also provides the compounds of formulae (1d) and (1e).

The resist composition may further comprise a second photoacid generator other than the photoacid generator (1). The use of photoacid generators of different types has the advantage of easy control in adjusting the properties of the resist including sensitivity, resolution, age stability and pattern profile in accordance with the intended use.

In a preferred embodiment, the polymer is a copolymer comprising p-hydroxystyrene and/or α-methyl-p-hydroxystyrene, p-hydroxystyrene and/or α-methyl-p-hydroxystyrene in which some of the hydrogen atoms of phenolic hydroxyl groups are partially replaced by acid labile groups of at least one type, and an acrylate and/or methacrylate, the acrylate and/or methacrylate being an ester protected with an acid labile group. The copolymer comprises recurring units of the general formula (2) wherein units derived from the acrylate and/or methacrylate are present in a proportion of more than 0 mol % to 50 mol %, on the average, and units having acid labile groups are present in a proportion of more than 0 mol % to 80 mol %, on the average, based on the entire copolymer, the copolymer having a weight average molecular weight of 3,000 to 100,000.

(2)

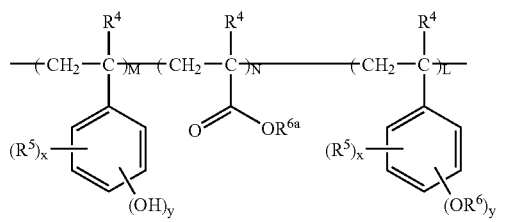

Herein $R^4$ is hydrogen or methyl, $R^5$ is a straight, branched or cyclic alkyl group of 1 to 8 carbon atoms, $R^6$ is an acid labile group, $R^{6a}$ is hydrogen or an acid labile group, at least some $R^{6a}$ groups, preferably all $R^{6a}$ groups being acid labile groups, x is 0 or a positive integer, y is a positive integer, and x+y is up to 5, M is a positive integer, N and L each are 0 or a positive integer, excluding that N and L are equal to 0 at the same time, and satisfying $0<N/(M+N)\leq 0.5$ and $0<(N+L)/(M+N+L)\leq 0.8$.

More preferably, in formula (2), the acid labile group represented by $R^6$ is selected from tertiary alkyl groups of 4 to 20 carbon atoms, preferably 4 to 15 carbon atoms, trialkylsilyl groups in which each alkyl moiety has 1 to 6 carbon atoms, oxoalkyl groups of 4 to 20 carbon atoms, and groups of the following general formulae (3) to (6); and the acid labile group represented by $R^{6a}$ is selected from tertiary alkyl groups of 4 to 20 carbon atoms, aryl-substituted alkyl groups of 7 to 20 carbon atoms, oxoalkyl groups of 4 to 20 carbon atoms, and groups of the following general formula (3). The polymer in the preferred or more preferred embodiment leads to a high contrast of dissolution of resist film before and after exposure, a high sensitivity, a high resolution, good age stability, and a satisfactory pattern profile. Owing to these advantages combined with high productivity of the polymer or resin, the composition is fully acceptable in industrial practice and especially suited as a micropatterning material for the manufacture of VLSI or the formation of photomask patterns.

(3)

(4)

(5)

(6)

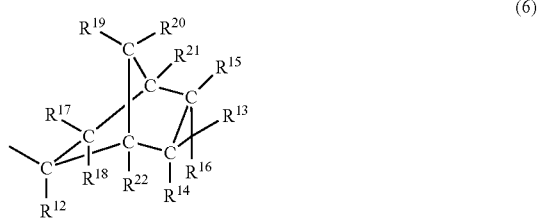

Herein $R^7$ and $R^8$ each are hydrogen or a straight, branched or cyclic alkyl group of 1 to 18 carbon atoms, preferably 1 to 10 carbon atoms, $R^9$ is a monovalent hydrocarbon group of 1 to 18 carbon atoms, preferably 1 to 10 carbon atoms which may contain a heteroatom such as oxygen, or a pair of $R^7$ and $R^8$, $R^7$ and $R^9$, or $R^8$ and $R^9$, taken together, may form a ring, each of $R^7$, $R^8$ and $R^9$ is a straight or branched alkylene group of 1 to 18 carbon atoms, preferably 1 to 10 carbon atoms when they form a ring;

$R^{10}$ is a tertiary alkyl group of 4 to 20 carbon atoms, preferably 4 to 15 carbon atoms, trialkylsilyl group in which each alkyl moiety has 1 to 6 carbon atoms, oxoalkyl group of 4 to 20 carbon atoms, or group of the formula (3), z is an integer of 0 to 6;

$R^{11}$ is a straight, branched or cyclic alkyl group of 1 to 8 carbon atoms or a substituted or unsubstituted aryl group of 6 to 20 carbon atoms, h is equal to 0 or 1, i is equal to 0, 1, 2 or 3, satisfying 2h+i=2 or 3;

$R^{12}$ is a straight, branched or cyclic alkyl group of 1 to 8 carbon atoms or a substituted or unsubstituted aryl group of 6 to 20 carbon atoms, $R^{13}$ to $R^{22}$ are each independently hydrogen or a monovalent hydrocarbon group of 1 to 15 carbon atoms which may contain a heteroatom, or adjacent two of $R^{13}$ to $R^{22}$ (e.g., $R^{13}$ and $R^{14}$, $R^{13}$ and $R^{15}$, $R^{14}$ and $R^{16}$, $R^{15}$ and $R^{16}$, $R^{17}$ and $R^{18}$, or $R^{19}$ and $R^{20}$), taken together, may form a ring of 4 to 32 carbon atoms with the carbon atoms to which they are attached, each of $R^{13}$ to $R^{22}$ being a divalent hydrocarbon group of 1 to 15 carbon atoms which may contain a heteroatom when they form a ring, or two of $R^{13}$ to $R^{22}$ which are attached to adjacent carbon atoms (e.g., $R^{13}$ and $R^{15}$, $R^{15}$ and $R^{21}$, or $R^{19}$ and $R^{21}$) may directly bond together to form a double bond.

A blend of two or more such polymers is preferred to a single polymer because the blend affords a higher contrast and mitigates the influence of the underlying substrate.

The resist composition may further comprise propylene glycol monomethyl ether acetate (PGMEA) and/or ethyl lactate as a solvent. The inclusion of the solvent permits to tailor the applicability, alkaline solubility and transmittance of the resist in accordance with the intended use.

A further aspect of the invention is a process for forming a pattern on a substrate such as a semiconductor substrate or mask substrate, comprising the steps of applying the resist composition onto a substrate to form a coating, heat treating the coating, exposing it to high-energy radiation, and developing it with a developer. The exposure may be followed by heat treatment (PEB) before development is carried out. The process may, of course, be followed by various steps such as etching, resist removal and cleaning steps.

Better results are expected from the resist composition of the invention, particularly when the substrate is a quartz substrate having a translucent film and/or a light-shielding film formed thereon by sputtering, commonly known as "blank." The high-energy radiation is typically an electron beam.

In summary, the chemically amplified positive resist composition of the invention has a high contrast of alkaline dissolution rate before and after exposure, a high sensitivity, a high resolution, and excellent age stability after exposure. Owing to these advantages, the composition is especially suited as a micropatterning material for the manufacture of VLSI by electron beam lithography and a mask pattern forming material.

DESCRIPTION OF THE PREFERRED EMBODIMENTS

Photoacid Generator

The chemically amplified positive resist composition of the invention comprises at least one compound (1) capable of generating an acid upon exposure to radiation or electron beams, selected from compounds having the formulae (1a), (1b), (1c), (1d) and (1e) shown below, as a photoacid generator, a polymer which changes its solubility in an alkaline developer under the action of the acid, and a basic compound.

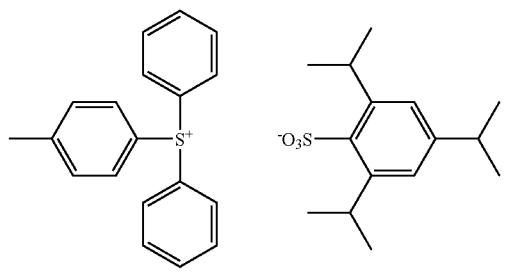

(1a)

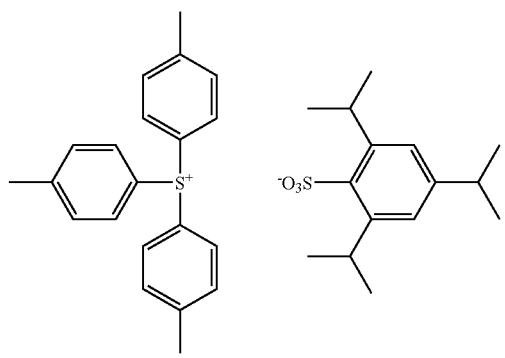

(1b)

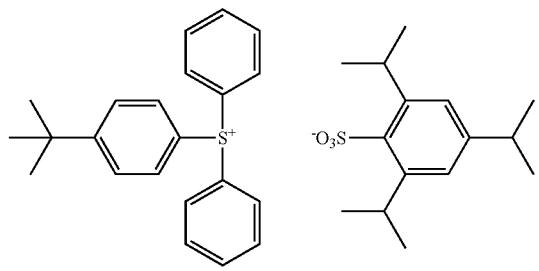

(1c)

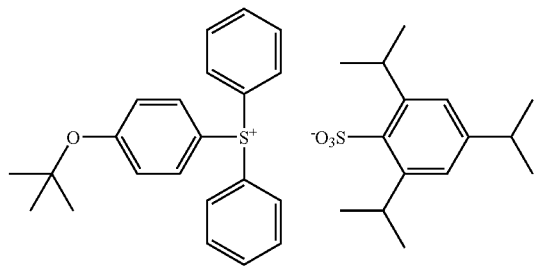

(1d)

-continued (1e)

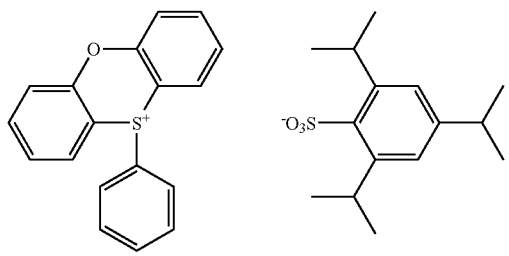

The photoacid generator (1) used herein may be a single compound or a mixture of two or more compounds. It is also contemplated to use the photoacid generator (1) in combination with a second photoacid generator other than the photoacid generator (1).

The second photoacid generator which can be used in combination with the photoacid generator (1) may be any compound capable of generating an acid upon exposure to high-energy radiation. Typical second photoacid generators include sulfonium salt, iodonium salt, sulfonyldiazomethane, and N-sulfonyloxyimide photoacid generators.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalenedicarboxyimide, phthalimide, cyclohexyldicarboxyimide, 5-norbornene-2,3-dicarboxyimide, and 7-oxabicyclo[2.2.1]-5-heptene-2,3-dicarboxyimide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate or the like.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,22-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p- toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

The preferred second photoacid generators are sulfonium salts, bisfulfonyldiazomethanes and N-sulfonyloxyimides.

While the optimum anion of the acid generated from the photoacid generator varies with such factors as the reactivity of acid labile groups on the polymer used in the resist composition, a choice is generally made among non-volatile and not so extremely diffusible anions. The preferred anions include benzenesulfonate, toluenesulfonate, 4-(4-toluenesulfonyloxy)benzenesulfonate, pentafluorobenzenesulfonate, 2,2,2-trifluoroethanesulfonate, nonafluorobutanesulfonate, heptadecafluorooctanesulfonate, camphorsulfonate, mesitylenesulfonate, and 2,4,6-triisopropylbenzenesulfonate anions.

With respect to the amount of addition to the resist composition, the photoacid generator (1), when used alone, is preferably present in an amount of 2 to 40 parts by weight, more preferably 5 to 20 parts by weight, relative to 80 parts by weight of the base resin, i.e., polymer to be described just below. When a mixture of two or more photoacid generators (1) or a mixture of the photoacid generator (1) and the second photoacid generator is used, the amount of each photoacid generator is preferably 0.5 to 20 parts by weight, more preferably 1 to 10 parts by weight, relative to 80 parts by weight of the base resin, and the total amount is preferably 2 to 40 parts by weight, more preferably 5 to 20 parts by weight, relative to 80 parts by weight of the base resin. Less than 2 parts by weight of the photoacid generator may fail to achieve a sufficient sensitivity. If more than 40 parts by weight of the photoacid generator is used, it may not be dissolved to the entirety. The transmittance of the resist film can be controlled by using a photoacid generator having a low transmittance at the exposure wavelength and adjusting the amount of the photoacid generator added.

Polymer

The polymer which is compounded as a base resin in the chemically amplified positive resist composition of the invention is not particularly limited as long as the polymer changes its solubility in an alkaline developer under the action of the acid which is generated from the photoacid generator upon exposure to high-energy radiation. In a preferred embodiment, the polymer is a copolymer comprising p-hydroxystyrene and/or α-methyl-p-hydroxystyrene, p-hydroxystyrene and/or α-methyl-p-hydroxystyrene in which some of the hydrogen atoms of phenolic hydroxyl groups are replaced by acid labile groups of at least one type, and an acrylate and/or methacrylate, the acrylate and/or methacrylate being an ester protected with an acid labile group. The copolymer should comprise recurring units of the general formula (2) wherein units derived from said acrylate and/or methacrylate are present in a proportion of more than 0 mol % to 50 mol %, on the average, and units having acid labile groups are present in a proportion of more than 0 mol % to 80 mol %, on the average, based on the entire copolymer. The copolymer should have a weight average molecular weight of 3,000 to 100,000.

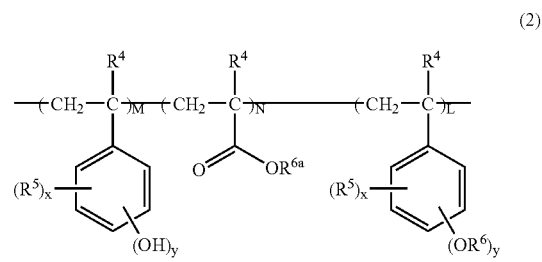

(2)

Herein $R^4$ is hydrogen or methyl, $R^5$ is a straight, branched or cyclic alkyl group of 1 to 8 carbon atoms, $R^6$ is an acid labile group, $R^{6a}$ is hydrogen or an acid labile group, at least some $R^{6a}$ groups being acid labile groups, x is 0 or a positive integer, y is a positive integer, and x+y is up to 5, M is a positive integer, N and L each are 0 or a positive integer, saving N=L=0, and satisfying $0<N/(M+N)\leq 0.5$ and $0<(N+L)/(M+N+L)\leq 0.8$.

Preferably, M, N and L satisfy the range:
$0.5\leq M/(M+N+L)\leq 0.9$,
especially $0.6\leq M/(M+N+L)\leq 0.8$,
$0\leq N/(M+N+L)\leq 0.3$,
especially $0.05\leq N/(M+N+L)\leq 0.15$,
$0.1\leq L/(M+N+L)\leq 0.4$,
especially $0.15\leq L/(M+N+L)\leq 0.25$,
$0.1\leq (N+L)/(M+N+L)\leq 0.5$,
especially $0.2\leq (N+L)/(M+N+L)\leq 0.4$.

The acid labile group represented by $R^6$ is preferably selected from groups of the following general formulae (3) to (6), tertiary alkyl groups of 4 to 20 carbon atoms, trialkylsilyl groups whose alkyl groups each have 1 to 6 carbon atoms, and oxoalkyl groups of 4 to 20 carbon atoms. The acid labile group represented by $R^{6a}$ is preferably selected from tertiary alkyl groups of 4 to 20 carbon atoms, aryl-substituted alkyl groups of 7 to 20 carbon atoms, oxoalkyl groups of 4 to 20 carbon atoms and groups of the following general formula (3).

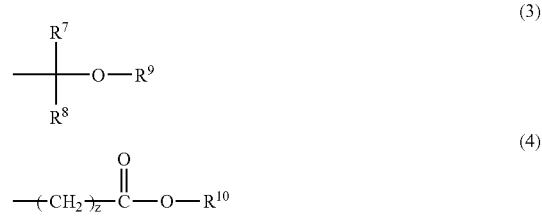

(3)

(4)

-continued

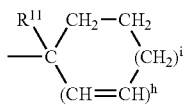
(5)

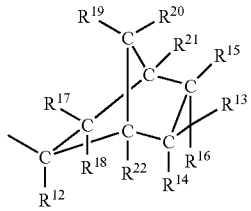
(6)

Herein $R^7$ and $R^8$ each are hydrogen or a straight, branched or cyclic alkyl group of 1 to 18 carbon atoms, preferably 1 to 10 carbon atoms, $R^9$ is a monovalent hydrocarbon group of 1 to 18 carbon atoms, preferably 1 to 10 carbon atoms, which may contain a heteroatom such as oxygen, or a pair of $R^7$ and $R^8$, $R^7$ and $R^9$, or $R^8$ and $R^9$, taken together, may form a ring, each of $R^7$, $R^8$ and $R^9$ is a straight or branched alkylene group of 1 to 18 carbon atoms, preferably 1 to 10 carbon atoms, when they form a ring.

$R^{10}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of the formula (3), and z is an integer of 0 to 6.

$R^{11}$ is a straight, branched or cyclic alkyl group of 1 to 8 carbon atoms or a substituted or unsubstituted aryl group of 6 to 20 carbon atoms, h is equal to 0 or 1, and i is equal to 0, 1, 2 or 3, satisfying 2h+i=2 or 3.

$R^{12}$ is a straight, branched or cyclic alkyl group of 1 to 8 carbon atoms or a substituted or unsubstituted aryl group of 6 to 20 carbon atoms, $R^{13}$ to $R^{22}$ are each independently hydrogen or a monovalent hydrocarbon group of 1 to 15 carbon atoms which may contain a heteroatom, or adjacent two of $R^{13}$ to $R^{22}$ (e.g., $R^{13}$ and $R^{14}$, $R^{13}$ and $R^{15}$, $R^{14}$ and $R^{16}$, $R^{15}$ and $R^{16}$, $R^{17}$ and $R^{18}$, or $R^{19}$ and $R^{20}$), taken together, may form a ring of 4 to 32 carbon atoms with the carbon atoms to which they are attached, each of $R^{13}$ to $R^{22}$ being a divalent hydrocarbon group of 1 to 15 carbon atoms which may contain a heteroatom when they form a ring. Alternatively, two of $R^{13}$ to $R^{22}$ which are attached to adjacent carbon atoms (e.g., $R^{13}$ and $R^{15}$, $R^{15}$ and $R^{21}$, or $R^{19}$ and $R^{21}$) may directly bond together to form a double bond.

Examples of the acetal groups of formula (3) are given below.

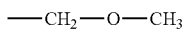 (AL11)-1

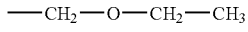 (AL11)-2

 (AL11)-3

 (AL11)-4

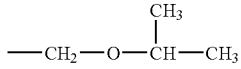 (AL11)-5

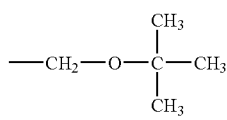 (AL11)-6

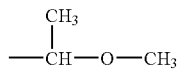 (AL11)-7

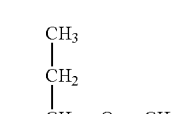 (AL11)-8

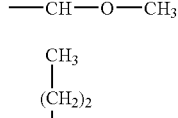 (AL11)-9

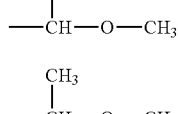 (AL11)-10

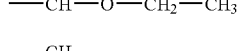 (AL11)-11

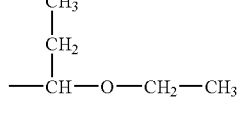 (AL11)-12

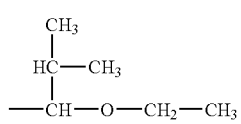 (AL11)-13

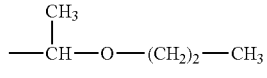 (AL11)-14

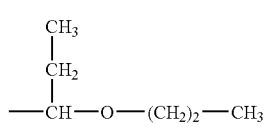 (AL11)-15

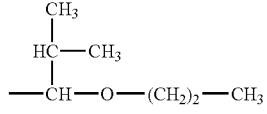 (AL11)-16

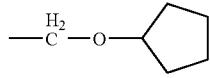 (AL11)-17

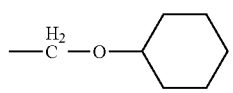 (AL11)-18

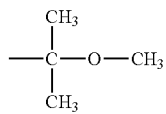 (AL11)-18

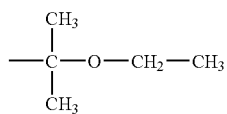 (AL11)-19

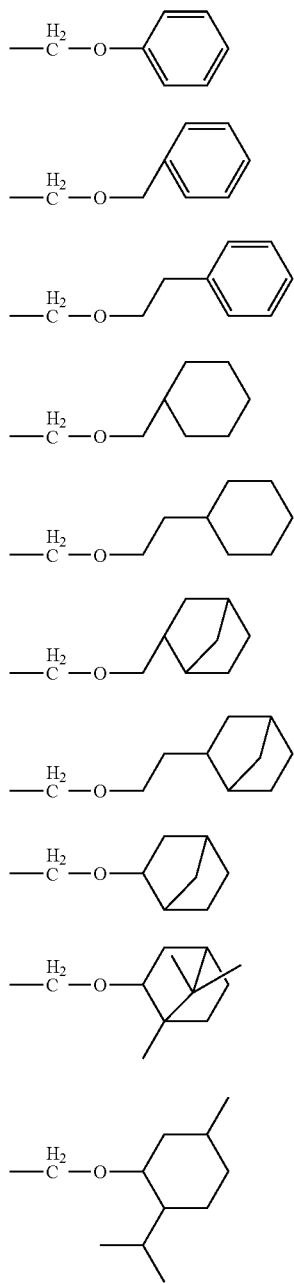

The polymer may be crosslinked within the molecule or between molecules with acid labile groups of the following general formula (AL-11a) or (AL-11b).

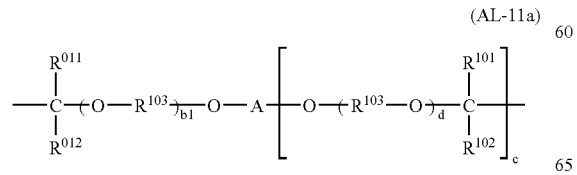

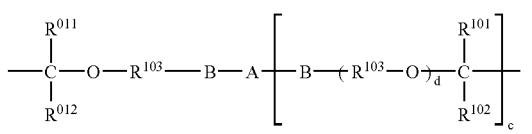

Herein $R^{011}$ and $R^{012}$ each are hydrogen or a straight, branched or cyclic alkyl group of 1 to 8 carbon atoms, or $R^{011}$ and $R^{012}$, taken together, may form a ring, and $R^{011}$ and $R^{012}$ are straight or branched alkylene groups of 1 to 8 carbon atoms when they form a ring. $R^{013}$ is a straight, branched or cyclic alkylene group of 1 to 10 carbon atoms. Each of b1 and d is 0 or an integer of 1 to 10, preferably 0 or an integer of 1 to 5, and c is an integer of 1 to 7. "A" is a (c+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted with hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic alkylene, alkyltriyl and alkyltetrayl groups of 1 to 20 carbon atoms, and arylene groups of 6 to 30 carbon atoms, which may be separated by a heteroatom such as oxygen, sulfur or nitrogen or in which some of the hydrogen atoms attached to carbon atoms may be substituted with hydroxyl, carboxyl, acyl groups or halogen atoms. The subscript c is an integer of 1 to 3.

The crosslinking acetal groups of formulae (AL-11a) and (AL-11b) are exemplified by the following formulae (AL11)-30 through (AL11)-37.

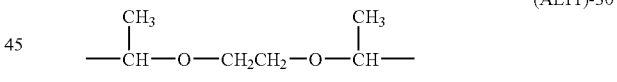

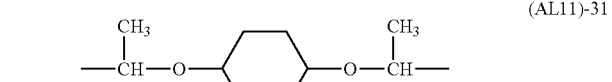

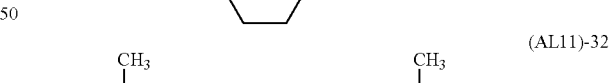

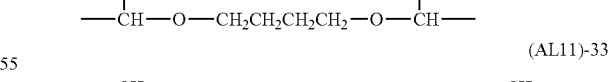

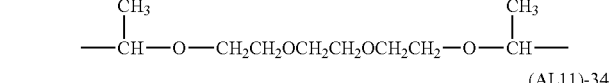

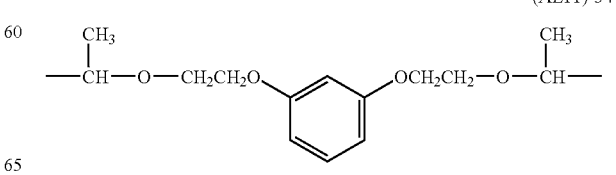

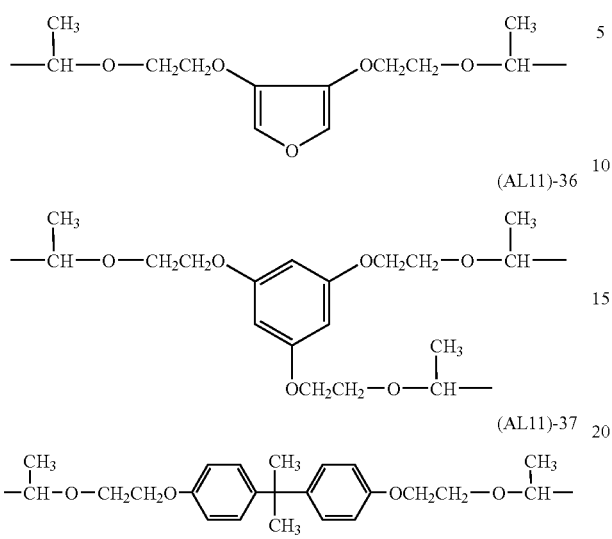

(AL11)-35

(AL11)-36

(AL11)-37

Illustrative examples of the acid labile groups of formula (4) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL10)-1 to (AL10)-9.

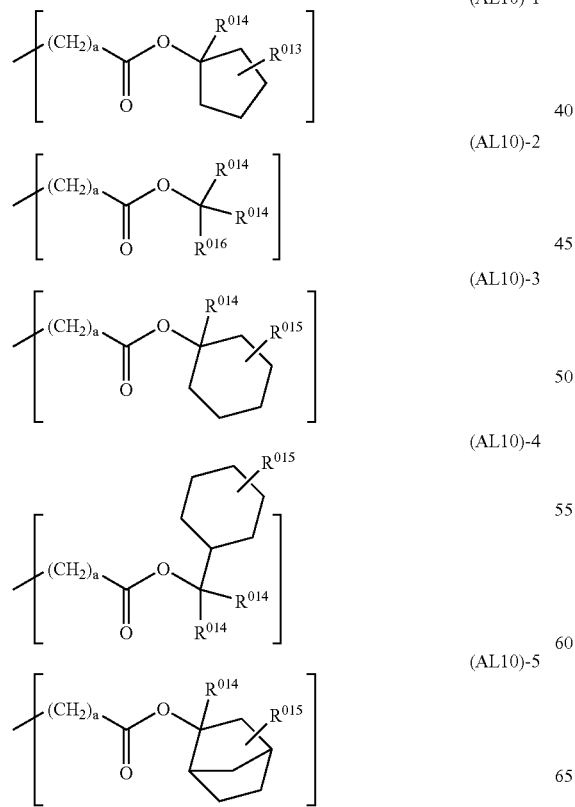

(AL10)-1

(AL10)-2

(AL10)-3

(AL10)-4

(AL10)-5

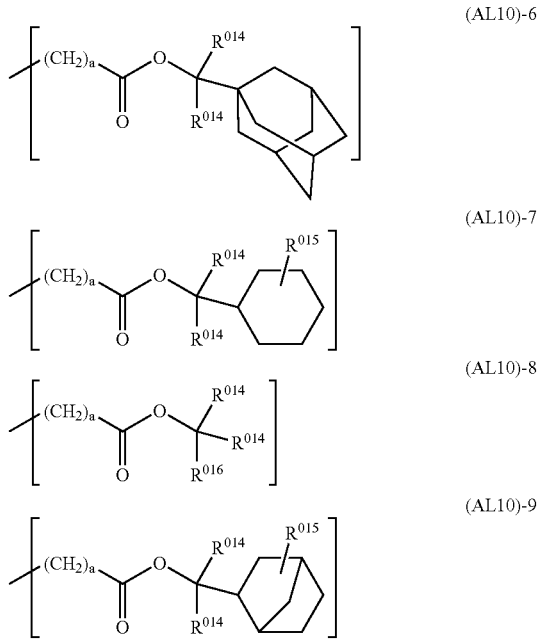

(AL10)-6

(AL10)-7

(AL10)-8

(AL10)-9

In formulae (AL10)-1 to (AL10)-9, $R^{014}$ is independently a straight, branched or cyclic alkyl group of 1 to 8 carbon atoms or an aryl or aralkyl group of 6 to 20 carbon atoms; $R^{015}$ is hydrogen or a straight, branched or cyclic alkyl group of 1 to 20 carbon atoms; $R^{016}$ is an aryl or aralkyl group of 6 to 20 carbon atoms; and "a" is an integer of 0 to 10.

Illustrative examples of the acid labile groups of formula (5) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, 3-ethyl-1-cyclohexen-3-yl, and 1-cyclohexyl-cyclopentyl.

In formula (6), suitable alkyl groups include methyl, ethyl, propyl, isopropyl, butyl, isobutyl, tert-butyl, pentyl, cyclopentyl, hexyl, cyclohexyl, and octyl, with those of 1 to 6 carbon atoms being preferred. The preferred aryl group is phenyl. Suitable monovalent hydrocarbon groups lo which may contain a heteroatom include alkyl groups as exemplified above, with those having 1 to 6 carbon atoms being preferred. Suitable divalent hydrocarbon groups which may contain a heteroatom include the foregoing monovalent hydrocarbon groups with one of the hydrogen atoms attached to carbon atoms being eliminated. When a pair of $R^{013}$ and $R^{014}$ or a similar pair form a ring, the ring preferably has 4 to 12 carbon atoms, more preferably 6 to 8 carbon atoms.

Illustrative examples of the acid labile groups of formula (6) are given below.

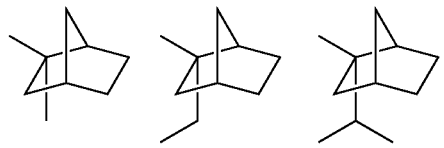

-continued

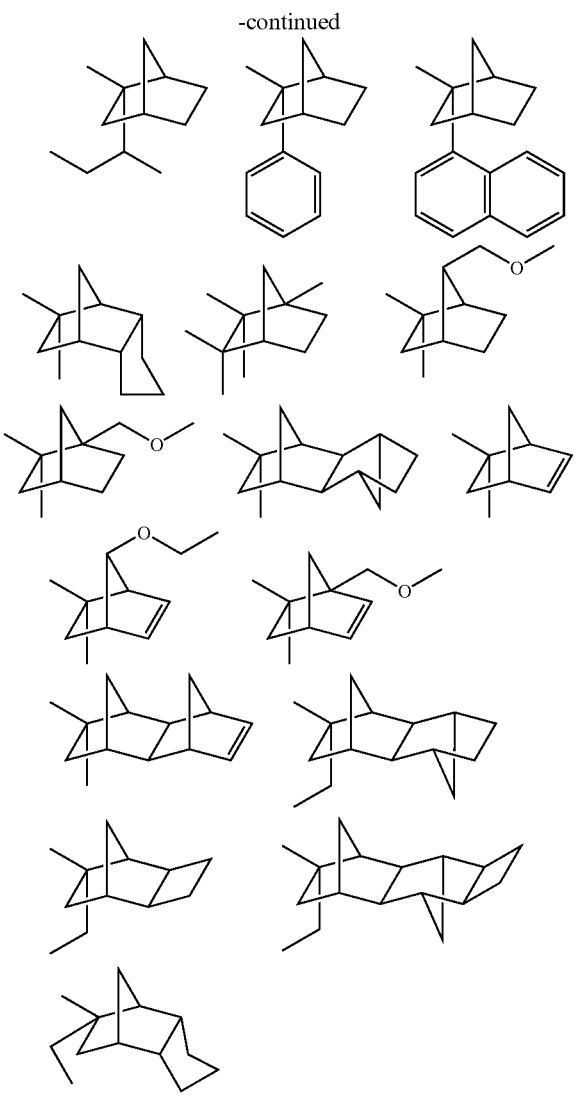

Suitable tertiary alkyl groups of 4 to 20 carbon atoms, preferably 4 to 15 carbon atoms, include tert-butyl, tert-amyl, 3-ethyl-3-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 1-adamantyl-1-methylethyl, 3-ethyl-3-pentyl, and dimethylbenzyl.

Suitable trialkylsilyl groups whose alkyl groups each have 1 to 6 carbon atoms include trimethylsilyl, triethylsilyl and tert-butyldimethylsilyl.

Suitable oxoalkyl groups of 4 to 20 carbon atoms include 3-oxocyclohexyl and groups of the following formulae.

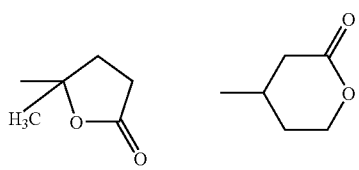

Suitable aryl-substituted alkyl groups of 7 to 20 carbon atoms include benzyl, methylbenzyl, dimethylbenzyl, diphenylmethyl and 1,1-diphenylethyl.

The above-described polymers may be used alone or in admixture as the base resin in a resist composition. A blend of two or more polymers is conveniently used in tailoring the balance of sensitivity, resolution, stability and pattern profile of resist.

Solvent

Most often the chemically amplified positive resist composition of the invention contains an organic solvent. Illustrative, non-limiting examples of the organic solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethyl sulfone.

Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 5 to 40% by weight and the alkyl lactate is 60 to 95% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight relative to 80 parts by weight of the base resin in the chemically amplified positive resist composition. The concentration is not limited to this range as long as film formation by existing methods is possible.

Basic Compound

The basic compound used herein is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridiium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

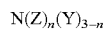  (B)-1

In the formula, n is equal to 1, 2 or 3; side chain Y is independently hydrogen or a straight, branched or cyclic alkyl group of 1 to 20 carbon atoms which may contain an ether or hydroxyl group; and side chain Z is independently selected from groups of the following general formulas (Z)-1 to (Z)-3, and two or three Z's may bond together to form a ring.

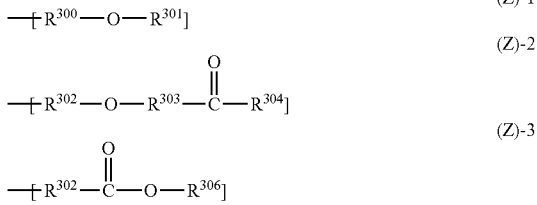

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compound may be used alone or in admixture of two or more. The basic compound is preferably formulated in an amount of 0 to 2 parts, and especially 0.01 to 1 part by weight, relative to 80 parts by weight of the base resin. More than 2 parts would result in too low a sensitivity.

The positive resist composition of the invention may further include a surfactant which is effective for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

To the resist composition, the surfactant is added in an amount of up to 2 parts, preferably up to 1 part by weight, relative to 80 parts by weight of the base resin.

For the microfabrication of integrated circuits, any well-known lithography may be used to form a resist pattern from the chemically amplified positive resist composition comprising the photoacid generator (1) and optionally, a second photoacid generator, a polymer preferably of formula (2) which changes its solubility in an alkaline developer under the action of an acid, an organic solvent, a basic compound, a surfactant and other components, as illustrated above, according to the invention. Electron beam lithography is most advantageously used because the composition exhibits a high reactivity and a high sensitivity to electron beams and remains stable in vacuum with time.

The resist composition is applied onto a substrate on which an integrated circuit is to be formed (e.g., Si, $SiO_2$, SiN, SiON, TiN, WSi, BPSG, SOG, organic antireflective film, etc.) or photomask blank by a suitable coating technique such as spin coating, roll coating, flow coating, dip coating, spray coating or doctor coating. The coating is prebaked on a hot plate at a temperature of 60 to 150° C. for about 1 to 20 minutes, preferably 80 to 120° C. for 1 to 10 minutes. The resulting resist film is generally 0.1 to 2.0 μm thick.

The resist film is then exposed to actinic radiation, preferably having an exposure wavelength of up to 300 nm, such as UV, deep-UV, electron beams, x-rays, excimer laser light, γ-rays and synchrotron radiation through a preselected photomask or directly. In the case of radiation exposure, the exposure dose is typically about 1 to 200 mJ/cm², preferably about 10 to 100 mJ/cm². In the case of electron beam exposure, the exposure dose is typically about 0.1 to 20 μC/cm², preferably about 3 to 10 μC/cm². The film is further baked on a hot plate at 60 to 150° C. for 1 to 20 minutes, preferably 80 to 120° C. for 1 to 10 minutes (post-exposure baking =PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dip, puddle or spray technique. The exposed area of the resist film in which acid labile groups on the polymer are deblocked by the acid is dissolved away whereas the unexposed area is kept undissolved. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation.

EXAMPLE

Examples of the invention are given below by way of illustration and not by way of limitation. The abbreviation NMR is nuclear magnetic resonance, IR is infrared spectroscopy, Mw is a weight average molecular weight, Mn is a number average molecular weight, and Mw/Mn is a molecular weight dispersity. Molecular weight was determined by gel permeation chromatography (GPC) versus polystyrene standards.

Synthesis Example 1

Synthesis of 2,4,6-triisopropylbenzenesulfonic acid

To 30.2 g (0.1 mol) of commercially available 2,4,6-triisopropylbenzenesulfonyl chloride were added 30 g of dimethyl sulfoxide and 30 g of water. The mixture was heated and stirred on an oil bath at 80° C. for 3 hours. The dimethyl sulfoxide/water solution was ready for use in the subsequent step of anion exchange reaction.

Synthesis Example 2

Synthesis of diphenyl-4-methylphenylsulfonium 2,4,6-triisopropylbenzenesulfonate In 100 g of dichloromethane were dissolved 20.2 g (0.1 mol) of diphenyl sulfoxide and 32.6 g (0.3 mol) of trimethylsilyl chloride. To the reaction solution which was ice cooled, a tetrahydrofuran solution of 4-methylphenylmagnesium chloride (0.3 mol) which was separately prepared was added dropwise such that the temperature might not exceed 20° C. Then, 10 g of 35 wt % aqueous hydrochloric acid and 200 g of water were added such that the temperature might not exceed 20° C. Finally 100 g of diethyl ether was added.

The water layer was separated, to which the dimethyl sulfoxide/water solution of 2,4,6-triisopropylbenzenesulfonic acid prepared in Synthesis Example 1 and 300 g of dichloromethane were added, followed by stirring.

The organic layer was separated, and washed with 200 g of water three times. The organic layer was the concentrated. Diethyl ether was added to the concentrate for recrystallization, yielding the target compound. The target compound was obtained as white crystals in an amount of 53.3 g and a yield of 95%. It was analyzed by $^1$H-NMR and IR spectroscopy, with the data shown below.

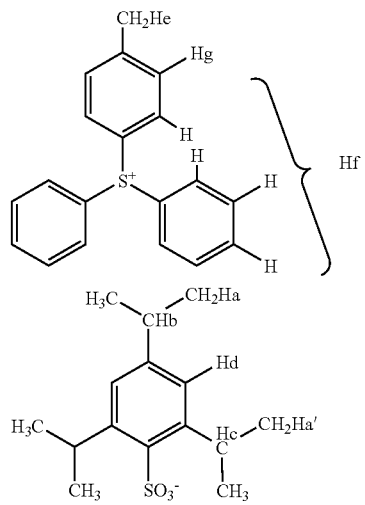

$^1$H-NMR (CDCl$_3$, σ ppm) 1.16-1.18 (12H, d, Ha'), 1.20-1.23 (6H, d, Ha), 2.41 (3H, s, He), 2.77-2.90 (1H, m, Hb), 4.68-4.82 (2H, m, Hc), 7.02 (2H, s, Hd), 7.38-7.41 (2H, d, Hg), 7.55-7.83 (12H, m, Hf)

IR (cm$^{-1}$) 3056, 2952, 2925, 2863, 1477, 1461, 1446, 1201, 1187, 1162, 1081, 1068, 1051, 1012, 997, 813, 757, 686, 674, 588, 559, 512, 503, 493

Synthesis Example 3

Synthesis of tris(4-methylphenyl)sulfonium 2,4,6-triisopropylbenzenesulfonate

Using a tetrahydrofuran solution of 4-methylphenylmagnesium chloride, thionyl chloride, and trimethylsilyl chloride, tris(4-methylphenyl)sulfonium chloride was synthesized according to the formulation shown in JP-A 8-311018. This sulfonium chloride was mixed with the sulfonic acid of Synthesis Example 1 whereupon anion exchange reaction was carried out as in Synthesis Example 2, yielding the target compound. The target compound was obtained as white crystals in an amount of 22.4 g and a yield of 38%. It was analyzed by $^1$H-NMR and IR spectroscopy, with the data shown below.

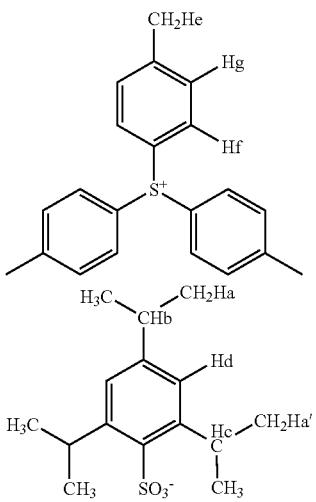

¹H-NMR (CDCl₃, σ ppm) 1.17-1.19 (12H, d, Ha'), 1.20-1.22 (6H, d, Ha), 2.40 (9H, s, He), 2.77-2.90 (1H, m, Hb), 4.70-4.82 (2H, m, Hc), 7.01 (2H, s, Hd), 7.36-7.39 (6H, d, Hg), 7.66-7.71 (6H, d, Hf)

IR (cm⁻¹) 3045, 2960, 2863, 1591, 1490, 1457, 1421, 1403, 1199, 1162, 1083, 1070, 1049, 1012, 809, 674, 588, 507

Synthesis Example 4

Synthesis of diphenyl-4-tert-butylphenylsulfonium 2,4,6-triisopropylbenzenesulfonate The target compound was prepared as in Synthesis Example 2 aside from using a tetrahydrofuran solution of 4-tert-butylphenylmagnesium chloride instead of the tetrahydrofuran solution of 4-methylphenylmagnesium chloride. The target compound was obtained as white crystals in an amount of 51.8 g and a yield of 86%. It was analyzed by ¹H-NMR and IR spectroscopy, with the data shown below.

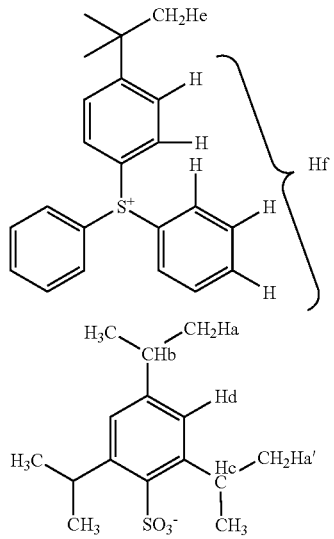

¹H-NMR (CDCl₃, σ ppm) 1.17-1.19 (12H, d, Ha'), 1.20-1.22 (6H, d, Ha), 1.31 (9H, s, He), 2.77-2.90 (1H, m, Hb), 4.69-4.83 (2H, m, Hc), 7.02 (2H, s, Hd), 7.55-7.85 (14H, m, Hf)

IR (cm⁻¹) 3058, 2958, 2904, 2865, 1477, 1461, 1446, 1214, 1193, 1162, 1083, 1070, 1049, 1014, 676, 590, 557, 511

Synthesis Example 5

Synthesis of tris(4-tert-butylphenyl)sulfonium 2,4,6-triisopropylbenzenesulfonate Using a tetrahydrofuran solution of 4-tert-butylphenylmagnesium chloride, thionyl chloride, and trimethylsilyl chloride, tris(4-tert-butylphenyl)sulfonium chloride was synthesized according to the formulation shown in JP-A 8-311018. This sulfonium chloride was mixed with the sulfonic acid of Synthesis Example 1 whereupon anion exchange reaction was carried out as in Synthesis Example 2, yielding the target compound. The target compound was obtained as white crystals in an amount of 28.6 g and a yield of 40%. It was analyzed by ¹H-NMR and IR spectroscopy, with the data shown below.

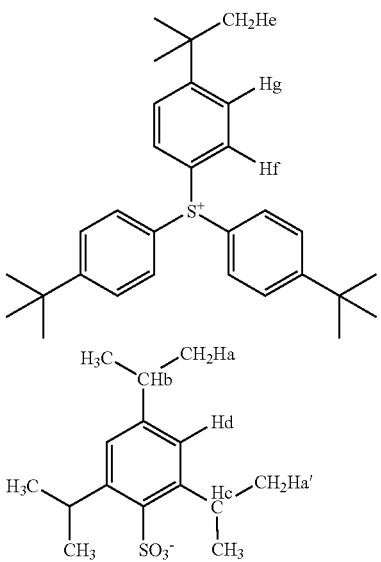

¹H-NMR (CDCl₃, σ ppm) 1.19-1.21 (12H, d, Ha'), 1.20-1.22 (6H, d, Ha), 1.31 (27H, s, He), 2.76-2.90 (1H, m, Hb), 4.72-4.85 (2H, m, Hc), 7.02 (2H, s, Hd), 7.60-7.63 (6H, d, Hg), 7.77-7.80 (6H, d, Hf)

IR (cm⁻¹) 2966, 2906, 2867, 1589, 1490, 1463, 1402, 1365, 1268, 1186, 1162, 1110, 1081, 1072, 1051, 1014, 836, 676, 597, 588, 561

Synthesis Example 6

Synthesis of diphenyl-4-tert-butoxyphenylsulfonium 2,4,6-triisopropylbenzenesulfonate Aside from using a tetrahydrofuran solution of 4-tert-butoxyphenylmagnesium chloride instead of the tetrahydrofuran solution of 4-tert-butylphenylmagnesium chloride and dichloromethane containing 5 wt % of triethylamine as the solvent, the procedure of Synthesis Example 4 was followed, obtaining 4-tert-butoxyphenyl-diphenylsulfonium chloride. Anion exchange reaction was then carried out as in Synthesis Example 2, yielding the target compound. The target compound was obtained as white crystals in an amount of 43.3 g and a yield of 70%. It was analyzed by ¹H-NMR and IR spectroscopy, with the data shown below.

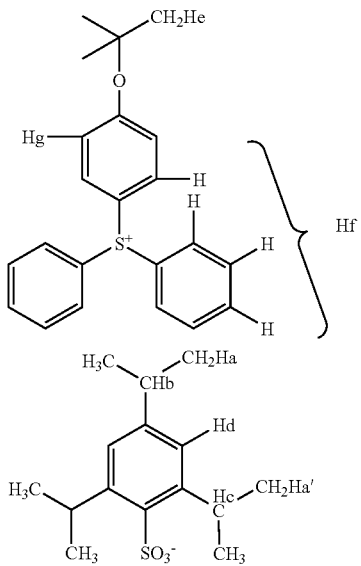

¹H-NMR (CDCl₃, σ ppm) 1.17-1.19 (12H, d, Ha'), 1.20-1.22 (6H, d, Ha), 1.43 (9H, S, He), 2.77-2.90 (1H, m, Hb), 4.69-4.83 (2H, m, Hc), 7.02 (2H, s, Hd), 7.15-7.18 (2H, d, Hg), 7.54-7.85 (12H, m, Hf)

IR (cm⁻¹) 3060, 2960, 2865, 1600, 1589, 1565, 1490, 1477, 1446, 1313, 1263, 1236, 1203, 1164, 1083, 1068, 1051, 1014, 906, 838, 750, 674, 588, 559, 543, 530, 501

Synthesis Example 7

Synthesis of phenoxthine-S-oxide 100 g (0.5 mol) of phenoxthine was dissolved in 1,600 g of acetic acid, to which 48.5 g (0.5 mol) of 35% aqueous hydrogen peroxide was added dropwise at room temperature. The mixture as stirred at room temperature for 7 days. Water, 3000 g, was added to the reaction solution whereupon white crystals precipitated. The crystals were collected by filtration and dried in reduced pressure, obtaining the target compound. There were obtained 90 g of white crystals in a yield of 83%.

Synthesis Example 8

Synthesis of 10-phenylphenoxthinium 2,4,6-triisopropylbenzenesulfonate

The target compound was synthesized as in Synthesis Example 2 except that phenoxthine-S-oxide in Synthesis Example 7 was used instead of the diphenyl sulfoxide in Synthesis Example 2. There were obtained 46.0 g of white crystals in a yield of 82%. It was analyzed by ¹H-NMR and IR spectroscopy, with the data shown below.

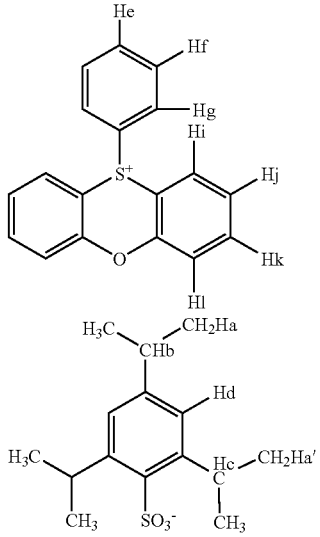

¹H-NMR (CDCl₃, σ ppm) 1.21-1.23 (12H, d, Ha'), 1.21-1.23 (6H, d, Ha), 2.78-2.91 (1H, m, Hb), 4.72-4.86 (2H, m, Hc), 7.05 (2H, s, Hd), 7.38-7.55 (7H, m, He, Hf, Hj, Hl), 7.72-7.78 (2H, m, Hk), 7.85-7.89 (2H, m, Hg), 8.44-8.48 (2H, d, Hi)

IR (cm⁻¹) 2946, 2925, 2863, 1591, 1581, 1477, 1461, 1438, 1272, 1226, 1121, 1199, 1182, 1160, 1132, 1083, 1062, 1049, 1012, 885, 761, 674, 588, 572, 559, 489

Examples 1-20 and Comparative Examples 1-3

Resist compositions were prepared as shown in Tables 1 to 3 by dissolving a polymer, a photoacid generator, a basic compound and other components in a solvent. The values in Tables 1 to 3 represent relative weight ratios. The components are identified below.

Polymers:
Polymer 1: hydroxystyrene-amyloxystyrene copolymer (hydroxystyrene:amyloxystyrene=72.5:27.5, Mw=16,100, Mw/Mn=1.73)
Polymer 2: hydroxystyrene-amyloxystyrene-1-ethylcyclopentyl methacrylate copolymer (hydroxystyrene: amyloxystyrene: 1-ethylcyclopentyl methacrylate=70.9:21.9:7.2, Mw=17,000, Mw/Mn=1.70)
Polymer 3: hydroxystyrene-methoxyisobutoxystyrene copolymer (hydroxystyrene:methoxyisobutoxystyrene=72:28, Mw=13,500, Mw/Mn=1.11)
Polymer 4: hydroxystyrene-t-butoxystyrene copolymer (hydroxystyrene:t-butoxystyrene=71:29, Mw=16,100, Mw/Mn=1.70)
Polymer 5: hydroxystyrene-t-butoxystyrene-1-ethylnorbornyl methacrylate copolymer (hydroxystyrene:t-butoxystyrene: 1-ethylnorbornyl methacrylate=75.9:18.8: 5.3, Mw=16,700, Mw/Mn=1.75)

Photoacid generators:
PAG 1: compound of Synthesis Example 2
PAG 2: compound of Synthesis Example 3
PAG 3: compound of Synthesis Example 4
PAG 4: compound of Synthesis Example 6
PAG 5: compound of Synthesis Example 8
PAG 6: triphenylsulfonium toluenesulfonate
PAG 7: triphenylsulfonium camphorsulfonate PAG 8: (4-tert-butoxyphenyl)diphenylsulfonium mesity-lenesulfonate
PAG 9: bis(tert-butylsulfonyl)diazomethane
PAG 10: (n-butylsulfonyl)-5-norbornene-2,3-dicarboxy-lic imide
Basic compound:
Base 1: tris[2-(methoxymethoxy)ethyl]amine
Base 2: tri-n-butylamine
Base 3: tris(2-acetoxyethyl)amine
Surfactant 1: FC-430 (Sumitomo 3M Co., Ltd.)
Surfactant 2: KH-20 (Asahi Glass Co., Ltd.)
Solvent 1: propylene glycol monomethyl ether acetate
Solvent 2: ethyl lactate

TABLE 1

| Components | Example | | | | | | | | | |
|---|---|---|---|---|---|---|---|---|---|---|
| (pbw) | 1 | 2 | 3 | 4 | 5 | 6 | 7 | 8 | 9 | 10 |
| Polymer 1 | | | | 80 | 80 | 80 | 80 | | | |
| Polymer 2 | 80 | 80 | 80 | | | | | | | |
| Polymer 3 | | | | | | | | 80 | 80 | 80 |
| Polymer 4 | | | | | | | | | | |
| Polymer 5 | | | | | | | | | | |
| PAG1 | 8 | | | | 4 | | 6 | | | |
| PAG2 | | 8 | | | | 4 | | | 2 | |
| PAG3 | | | 8 | | | | | 2 | | 6 |
| PAG4 | | | | 8 | | | | | | 2 |
| PAG5 | | | | | 8 | | | | 6 | |
| PAG6 | | | | | | 4 | | | | |
| PAG7 | | | | | | | 4 | | | |
| PAG8 | | | | | | | | | | 2 |
| PAG9 | | | | | | | | | | |
| PAG10 | | | | | | | | | | |
| Base 1 | 0.4 | 0.4 | 0.4 | 0.4 | 0.4 | | | | | |
| Base 2 | | | | | | 0.4 | 0.4 | | | 0.4 |
| Base 3 | | | | | | | | 0.4 | 0.4 | |
| Surfactant 1 | | | | | | | | 0.2 | 0.2 | |
| Surfactant 2 | 0.2 | 0.2 | 0.2 | 0.1 | 0.1 | 0.1 | 0.1 | | | 0.1 |
| Solvent 1 | 650 | 650 | 650 | 430 | 430 | 870 | 870 | 650 | 650 | 430 |
| Solvent 2 | 650 | 650 | 650 | 870 | 870 | 430 | 430 | 650 | 650 | 870 |

TABLE 2

| Components | Example | | | | | | | | | |
|---|---|---|---|---|---|---|---|---|---|---|
| (pbw) | 11 | 12 | 13 | 14 | 15 | 16 | 17 | 18 | 19 | 20 |
| Polymer 1 | | | | 40 | 40 | | | 40 | 40 | |
| Polymer 2 | | | | | | 40 | | 40 | 40 | |
| Polymer 3 | | | | 40 | | 40 | 40 | | | |
| Polymer 4 | 80 | 80 | | | | | 40 | 40 | | |
| Polymer 5 | | | 80 | | 40 | | | | 40 | 40 |
| PAG1 | | | | | | 6 | | 4 | | |
| PAG2 | | | | | | | | | 8 | |
| PAG3 | 4 | | | 6 | | | 4 | | | |
| PAG4 | | | | 2 | 8 | | 2 | | | 8 |
| PAG5 | | 4 | 4 | | | | 2 | 2 | | |
| PAG6 | | | | | 4 | | | | | 4 |
| PAG7 | | | | | | | | | | |
| PAG8 | | | | | | 2 | | | | |
| PAG9 | 4 | | 2 | | | | | 2 | 2 | |
| PAG10 | | 4 | 2 | | | | | | 2 | |
| Base 1 | | | | | 0.4 | | | | | 0.4 |
| Base 2 | 0.4 | 0.4 | | 0.4 | | 0.4 | 0.4 | | 0.2 | |
| Base 3 | | | 0.4 | | | | | 0.4 | 0.2 | |
| Surfactant 1 | | | 0.2 | | | | | 0.2 | 0.1 | |
| Surfactant 2 | 0.1 | 0.1 | | 0.1 | 0.2 | 0.1 | 0.1 | | | 0.2 |
| Solvent 1 | 430 | 430 | 650 | 430 | 650 | 430 | 430 | 650 | 650 | 650 |
| Solvent 2 | 870 | 870 | 650 | 870 | 650 | 870 | 870 | 650 | 650 | 650 |

TABLE 3

| Components | Comparative Example | | |
|---|---|---|---|
| (pbw) | 1 | 2 | 3 |
| Polymer 1 | | 80 | |
| Polymer 2 | 80 | | |
| Polymer 3 | | | 80 |
| Polymer 4 | | | |
| Polymer 5 | | | |
| PAG1 | | | |
| PAG2 | | | |

TABLE 3-continued

| Components | Comparative Example | | |
|---|---|---|---|
| (pbw) | 1 | 2 | 3 |
| PAG3 | | | |
| PAG4 | | | |
| PAG5 | | | |
| PAG6 | 10 | | |
| PAG7 | | 10 | |
| PAG8 | | | 5 |
| PAG9 | | | 5 |
| PAG10 | | | |
| Base 1 | 0.4 | | |
| Base 2 | | 0.4 | |
| Base 3 | | | 0.4 |
| Surfactant 1 | | | 0.2 |
| Surfactant 2 | 0.2 | 0.2 | |
| Solvent 1 | 430 | 650 | 430 |
| Solvent 2 | 870 | 650 | 870 |

Each resist composition, after passing through a fluoro-resin filter having a pore size of 0.2 μm, was spin coated on a silicon wafer or a chromium-deposited silicon wafer and baked on a hot plate at 110° C. for 4 minutes to form a resist film of 0.3 μm thick.

The resist film was exposed on an electron beam lithography system model HL-800D (Hitachi High-Technologies Corp., accelerating voltage 50 keV), then baked (PEB) at 110° C. for 4 minutes, and developed with a 2.38% aqueous solution of tetramethylammonium hydroxide, forming a positive pattern.

The resulting resist patterns (Examples 1-13, Comparative Examples 1-3) were evaluated. The optimum exposure (Eop) was defined as the exposure dose (μC/cm$^2$) which provided a 1:1 resolution between the top and the bottom of a 0.20 μm line-and-space pattern. The resolution of the resist under evaluation was defined as the minimum line width (μm) of the lines and spaces that was ascertained separate at the optimum exposure. The profile of resolved resist pattern was evaluated by observing a cross section of the resist under a scanning electron microscope.

The post-exposure delay (PED) in vacuum was examined. After exposure on the electron beam exposure system, the resist film was held for 24 hours in a vacuum chamber, followed by PEB and development. The line width of the 0.20-μm L/S pattern at Eop was compared between the PED case and the case where exposure was immediately followed by PEB, determining a difference (nm).

Storage stability was judged in terms of foreign matter precipitation or sensitivity change with the passage of time. After the resist solution was aged for 100 days at the longest, the number of particles of greater than 0.3 μm per ml of the resist solution was counted by means of a particle counter KL-20A (Rion Co., Ltd.), and the foreign matter precipitation was determined "good" when the number of particles is not more than 5. Also, the sensitivity change was rated "good" when a change with time of sensitivity (Eop) was within 5% from that immediately after preparation, and "poor" when the change is more than 5%.

Table 4 summarizes the sensitivity, threshold resolution, PED in vacuum, storage stability, pattern profile on the silicon wafer, and pattern profile on the Cr-deposited silicon wafer.

TABLE 4

| | Eop (μC/cm$^2$) | Threshold resolution (nm) | PED in vacuum (nm) | Storage stability | Pattern profile on Si | Pattern profile on Cr |
|---|---|---|---|---|---|---|
| Example 1 | 9.8 | 85 | 4.2 | good | rectangular | rectangular |
| Example 2 | 9.0 | 80 | 4.8 | good | rectangular | rectangular |
| Example 3 | 8.2 | 90 | 4.2 | good | rectangular | rectangular |
| Example 4 | 7.8 | 85 | 5.0 | good | rectangular | rectangular |
| Example 5 | 9.9 | 85 | 6.8 | good | rectangular | rectangular |
| Example 6 | 10.5 | 100 | 6.9 | good | somewhat reverse tapered | somewhat reverse tapered |
| Example 7 | 9.0 | 100 | 3.9 | good | somewhat reverse tapered | somewhat reverse tapered |
| Example 8 | 12.2 | 95 | 6.2 | good | rectangular | rectangular |
| Example 9 | 12.4 | 95 | 8.2 | good | rectangular | rectangular |
| Example 10 | 13.5 | 95 | 2.9 | good | rectangular | rectangular |
| Example 11 | 9.6 | 80 | 2.6 | good | rectangular | rectangular + some footing |
| Example 12 | 7.4 | 70 | 3.5 | good | rectangular | rectangular + some footing |
| Example 13 | 13.0 | 95 | 5.5 | fair | rectangular | rectangular |
| Example 14 | 9.9 | 90 | 9.2 | good | rectangular | rectangular |
| Example 15 | 7.5 | 85 | 7.2 | good | rectangular | rectangular |
| Example 16 | 9.0 | 85 | 6.2 | good | rectangular | rectangular |
| Example 17 | 8.8 | 85 | 4.9 | good | rectangular | rectangular |
| Example 18 | 12.2 | 80 | 5.5 | good | rectangular | rectangular |
| Example 19 | 11.1 | 80 | 6.0 | good | rectangular | rectangular |
| Example 20 | 8.4 | 75 | 7.1 | good | rectangular | rectangular |
| Comparative Example 1 | 9.0 | 110 | 12.0 | good | rectangular | rectangular |
| Comparative Example 2 | 13.9 | 125 | 4.2 | poor | reverse tapered | reverse tapered + footing |
| Comparative Example 3 | 16.8 | 130 | 11.4 | good | rectangular | rectangular + footing |

As is evident from Table 4, the chemically amplified positive resist compositions of the invention, when processed by photolithography, exhibit a high sensitivity, a high resolution, and satisfactory storage stability. The compositions of Comparative Examples fail in at least one of these properties.

Japanese Patent Application No. 2004-120635 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising:
(A) at least one compound (1) of formula (1e) shown below, said compound (1) being capable of generating an acid upon exposure to radiation or electron beams;

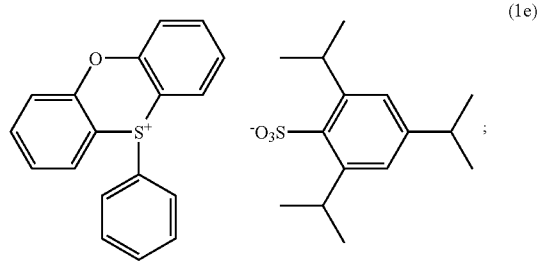
(1e)

(B) a copolymer comprising p-hydroxystyrene and/or α-methyl-p-hydroxystyrene, p-hydroxystyrene and/or α-methyl-p-hydroxystyrene in which some of the hydrogen atoms of phenolic hydroxyl groups are replaced by acid labile groups of at least one type, and an acrylate and/or methacrylate, said acrylate and/or methacrylate being an ester protected with an acid labile group, said copolymer comprising recurring units of the general formula (2) wherein units derived from said acrylate and/or methacrylate are present in a proportion of more than 0 mol % to 50 mol %, on the average, and units having acid labile groups are present in a proportion of more than 0 mol % to 80 mol %, on the average, based on the entire copolymer, said copolymer having a weight average molecular weight of 3,000 to 100,000,

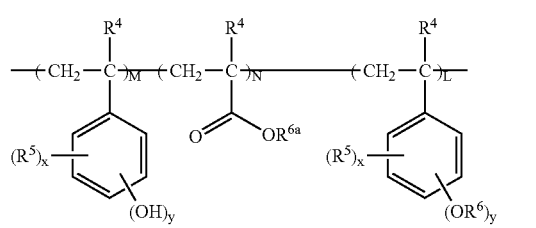
(2)

wherein $R^4$ is hydrogen or methyl, $R^5$ is a straight, branched or cyclic alkyl group of 1 to 8 carbon atoms, $R^6$ is an acid labile group, $R^{6a}$ is hydrogen or an acid labile group, at least some $R^{6a}$ groups being acid labile groups, x is 0 or a positive integer, y is a positive integer, and x+y is up to 5, M is a positive integer, N and L each are 0 or a positive integer, excluding that N and L are equal to 0 at the same time, and satisfying $0<N/(M+N)\leqq0.5$ and $0<(N+L)/(M+N+L)\leqq0.8$; and (C) a basic compound.

2. The resist composition of claim 1, further comprising a second photoacid generator other than said compound (1).

3. The resist composition of claim 1, wherein in formula (2), the acid labile group represented by $R^6$ is selected from tertiary alkyl groups of 4 to 20 carbon atoms, trialkylsilyl groups in which each alkyl moiety has 1 to 6 carbon atoms, oxoalkyl groups of 4 to 20 carbon atoms, and groups of the following general formulae (3) to (6), and the acid labile group represented by $R^{6a}$ is selected from tertiary alkyl groups of 4 to 20 carbon atoms, aryl-substituted alkyl groups of 7 to 20 carbon atoms, oxoalkyl groups of 4 to 20 carbon atoms, and groups of the following general formula (3):

(3)

(4)

(5)

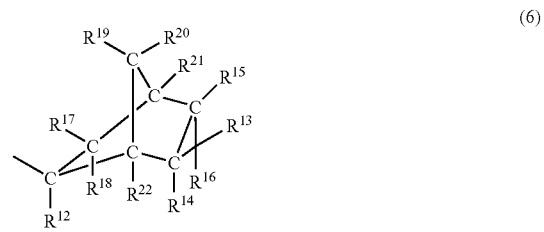
(6)

wherein $R^7$ and $R^8$ each are hydrogen or a straight, branched or cyclic alkyl group of 1 to 18 carbon atoms, $R^9$ is a monovalent hydrocarbon group of 1 to 18 carbon atoms which may contain a heteroatom such as oxygen, or a pair of $R^7$ and $R^8$, $R^7$ and $R^9$, or $R^8$ and $R^9$, taken together, may form a ring, each of $R^7$, $R^8$ and $R^9$ is a straight or branched alkylene group of 1 to 18 carbon atoms when they form a ring;

$R^{10}$ is a tertiary alkyl group of 4 to 20 carbon atoms, trialkylsilyl group in which each alkyl moiety has 1 to 6 carbon atoms, oxoalkyl group of 4 to 20 carbon atoms, or group of the formula (3), z is an integer of 0 to 6;

$R^{11}$ is a straight, branched or cyclic alkyl group of 1 to 8 carbon atoms or a substituted or unsubstituted aryl group of 6 to 20 carbon atoms, h is equal to 0 or 1, i is equal to 0, 1, 2 or 3, satisfying 2h+i =2 or 3, $R^{12}$ is a straight, branched or cyclic alkyl group of 1 to 8 carbon atoms or a substituted or unsubstituted aryl group of 6 to 20 carbon atoms, $R^{13}$ to $R^{22}$ are each independently hydrogen or a monovalent hydrocarbon group of 1 to 15 carbon atoms which may contain a heteroatom, or adjacent two of $R^{13}$ to $R^{22}$, taken together, may form a ring of 4 to 32 carbon atoms with the carbon atoms to which they are attached, each R being a divalent hydrocarbon group of 1 to 15 carbon atoms which may contain a heteroatom when they form a ring, or two of $R^{13}$ to $R^{22}$ which are attached to adjacent carbon atoms may directly bond together to form a double bond.

4. The resist composition of claim 1, wherein said polymer comprises a plurality of polymers.

5. The resist composition of claim 1, further comprising propylene glycol monomethyl ether acetate or ethyl lactate or both as a solvent.

6. A compound having the formula (1e):

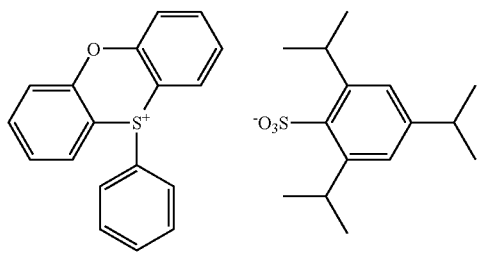

(1e)

7. A process for forming a pattern comprising the steps of applying the resist composition of claim 1 onto a substrate, heat treating, exposing to high-energy radiation, and developing with a developer.

8. The process of claim 7, wherein the substrate is a quartz substrate having a translucent film andlor a light-shielding film formed thereon by sputtering.

9. The process of claim 7, wherein the high-energy radiation is an electron beam.

* * * * *